United States Patent [19]
Norsworthy

[11] Patent Number: 5,420,584
[45] Date of Patent: May 30, 1995

[54] DATA CONVERTER WITH BARREL SHIFTER

[75] Inventor: Steven R. Norsworthy, Emmaus, Pa.

[73] Assignee: AT&T Corp., Murray Hill, N.J.

[21] Appl. No.: 168,888

[22] Filed: Dec. 16, 1993

[51] Int. Cl.⁶ .............................................. H03M 1/02
[52] U.S. Cl. .................................. 341/110; 341/144; 341/155
[58] Field of Search ................ 341/110, 61, 144, 155, 341/89

[56] References Cited

U.S. PATENT DOCUMENTS 5,144,308 9/1992 Norsworthy ........................ 341/131
5,313,648 5/1994 Ehlig et al. ........................ 395/800

OTHER PUBLICATIONS

An Audio Engineering Society Preprint Presented at the 95th Convention 1993, Oct. 7-10, New York, "A Single Chip Stereo Audio Codec for PC Multimedia Applications", by Scott McDonald, et al., Crystal Semiconductor Corporation, Austin, Tex., pp. 1-13.
Oversampling Delta-Sigma Data Converters, Theory, Design and Simulation, edited by James C. Candy and Gabor C. Temes, IEEE Press, A Selected Reprint Volume published in 1992, "Oversampling Methods for A/D and D/A Conversion", pp. 1-29.
Motorola DSP56166 "Digital Signal Processor" User's Manual, pp. 6-2-6-29.
"Digital Dither: Signal Processing with Resolution Far Below the Least Significant Bit", by Vanderkooy, et al., Audio Research Group, University of Waterloo, Waterloo, Ontario, Canada, pp. 87-96, AES 7th International Conference-Audio in Digital Times, Toronto, Canada May 14-17, 1989.

*Primary Examiner*—Brian K. Young
*Attorney, Agent, or Firm*—David L. Smith

[57] ABSTRACT

There is disclosed of the invention, a data converter for converting a signal from one form to another converts signals from analog-to-digital or from digital-to-analog form. The converter has an analog side and a digital sample side. A programmable barrel shift selector on the digital side receives digital signal samples of a first bit field width and selects a second bit field width as the output. The second bit field width is programmable over a range to selectively determine which bits in the first bit field are included in the second bit field.

20 Claims, 3 Drawing Sheets

DATA CONVERTER WITH BARREL SHIFTER

TECHNICAL FIELD

This application relates generally to data converters such as encoders or decoders for converting signals from analog-to-digital form, or from digital-to-analog form, and particularly to such converters including a barrel selector to select a particular one of several possible bit fields for further processing.

BACKGROUND OF THE INVENTION

Data converters are used in many applications such as telephone switching equipment, voice band data communications, speech coding systems, and audio and video signal processing equipment. The converters typically have a decimator or an interpolator which changes data from analog to digital form or vice versa. Each decimator or interpolator in a data converter, or each stage of decimation or interpolation, requires two clock frequencies for operation. The ratio of the higher frequency to the lower frequency is known as the decimation factor in a decimator and as the interpolation factor in an interpolator. Data converters have typically had fixed decimation and interpolation factors. A fixed decimation factor or a fixed interpolation factor determines the gain of the decimator or interpolation. The bit width of the data path downstream of the decimator or interpolator could be predetermined to avoid overflow knowing the decimation factor or interpolation factor, and hence the gain of the decimator or interpolator. When programmability is introduced into the decimation and interpolation factors, to avoid overflow the minimum bit width of the data path downstream of a decimator or interpolator becomes a variable that is dependent upon the decimation or interpolation factor. Alternatively, a data path having an excessively wide bit width can be used, however, this approach would be inefficient and is therefore undesirable.

What is needed is a technique for selecting the appropriate bit field from a wider bit field produced by an interpolator or decimator having a variable, programmable decimation or interpolation factor.

SUMMARY OF THE INVENTION

In accordance with an embodiment of the invention, a data converter for converting a signal from one form to another converts signals from analog-to-digital or from digital-to-analog form. The converter has an analog side and a digital sample side. A programmable barrel shift selector on the digital side receives digital signal samples of a first bit field width and selects a second bit field width as the output. The second bit field width is programmable over a range to selectively determine which bits in the first bit field are included in the second bit field.

DETAILED DESCRIPTION

Figure 1:
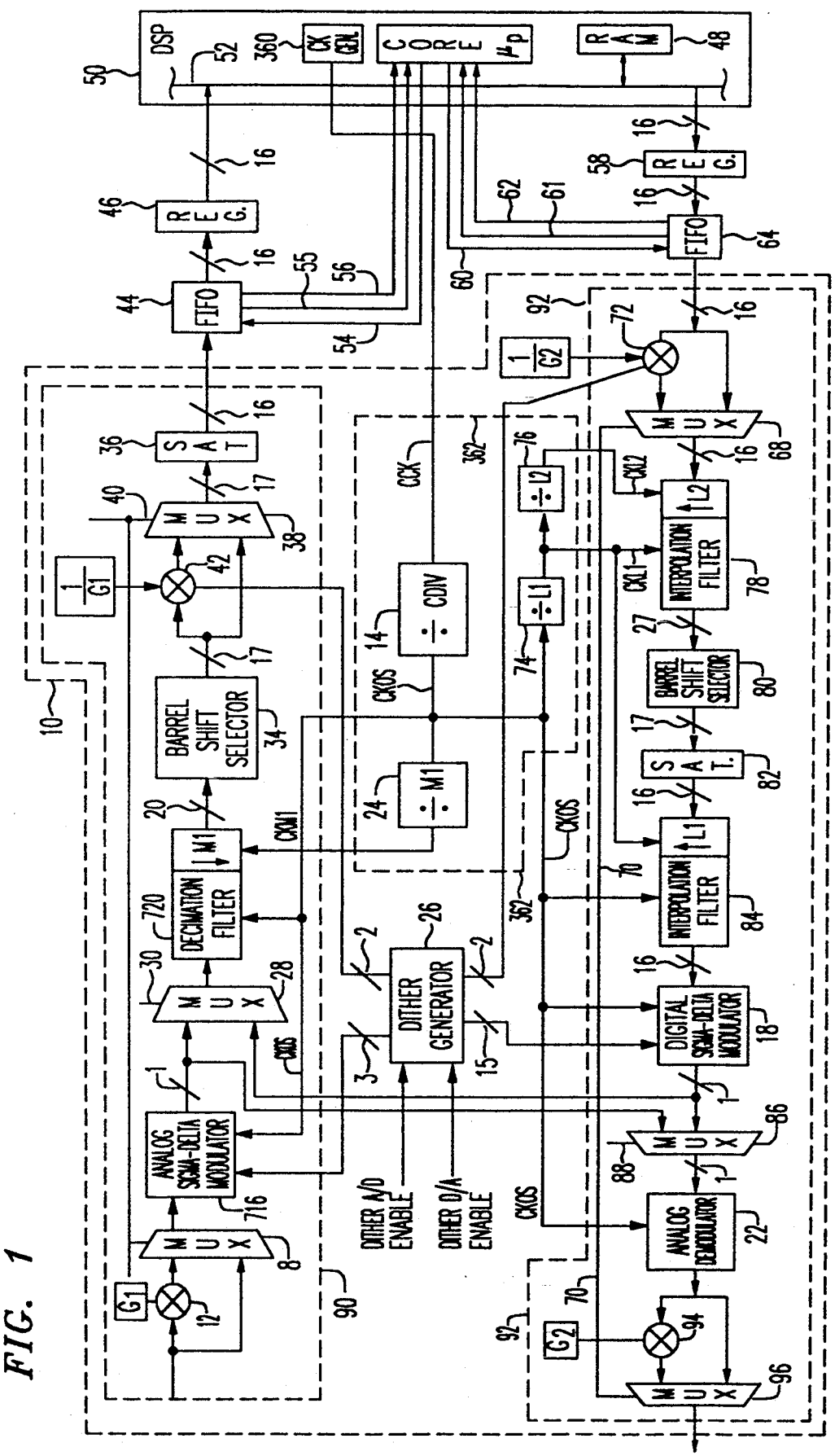
FIG. 1 is a block diagram of a data converter in accordance with the present invention.

An illustrative data converter 10 including gain dither and rounding is shown in FIG. 1. Data converter 10 is shown as having an analog-to-digital (A/D) conversion signal path including coder 90, which is an A/D type data converter. The A/D conversion path includes an analog sigma-delta modulator 716, decimation filter 720, barrel shift selector 34 and saturation circuit 36. The digital-to-analog (D/A) conversion signal path includes decoder 92 which is a D/A type data converter. The digital-to-analog conversion path includes interpolation filter 78, barrel shift selector 80, saturation circuit 82, interpolation filter 84, digital sigma-delta modulator 18 and analog demodulator 22.

Data converter 10 is clocked by incoming clock signal CCK as divided by a programmable divide-by-CDIV clock divider 14 to produce the oversampling clock signal CKOS. Oversampling clock signal CKOS is provided as an input to and is used by analog sigma-delta modulator 716, digital sigma-delta modulator 18, decimation filter 720, interpolation filter 84, and analog demodulator 22. In a preferred embodiment, the sigma-delta modulators are second order. Oversampling clock signal CKOS is also coupled as the input of programmable divide-by-M1 counter 24 and programmable divide-by-L1 counter 74. M1 is the decimation factor of decimation filter 720. The output of divide-by-M1 counter 24 provides to decimation filter 720 a second clock signal, decimation clock signal CKM, that has a frequency equal to that of the oversampling clock signal CKOS divided by the decimation factor M1. The upstream portion of decimation filter 720 operates at the rate of clock CKOS. The downstream portion operates at the lower, decimated rate of clock CKM. In a illustrative embodiment, decimation filter 720 is a third-order comb filter.

The analog input signal to the A/D conversion signal path 90 provides one input directly to multiplexer 8. The analog input signal multiplied by a programmable gain G1 in multiplier 12 is provided as the other input to multiplexer 8. Multiplexer 8 is responsive to select input 40 to selectively provide one of its analog inputs as its analog output signal.

The analog output signal provided by multiplexer 8 is received by analog sigma-delta modulator 716 as its input. The analog sigma-delta modulator, which may receive dither from dither generator 26, converts the scaled analog input signal into a 1-bit-per-sample first digital data stream. As is known in the art, the 1-bit-per-sample first digital data stream generated by a sigma-delta modulator is converted from a signal represented by zeroes and ones (unsigned data format) to a two-bit-per-sample signal represented by minus ones and plus ones which are consistent with two's complements or sign-magnitude format. Such a representation has a midpoint represented by zero, can take the form of a two's-complement word, and has a sign associated with each value. The output of analog sigma-delta modulator 716 provides an input to multiplexer 28. Multiplexer 28 is responsive to user-determined select input 30 to selectively provide one of its inputs at its output. The output of multiplexer 28 is coupled as the input to decimation filter 720.

Decimation filter 720 filters and decimates the 1-bit-per-sample first digital data stream into a 20-bit-per-sample second digital data stream at the frequency of clock CKM1. The filtering removes out of band energy.

In the illustrative embodiment, decimation filter 720 is a third-order comb filter.

Barrel shift selector 34 receives the second digital data stream from the output of decimation filter 720, up to 20 bits per sample, and produces as an output a third digital data stream having 17 bits per sample. The barrel shift selector 34 is programmable and can be varied to select one of four possible bit fields: bits 0–16, 1–17, 2–18, or 3–19.

The 17-bit-per-sample third digital data stream output from barrel shift selector 34 provides the input to saturation circuit 36 through multiplexer 38. The output from barrel shift selector 34 is provided directly as one input to multiplexer 38. The output from barrel shift selector 34 is multiplied by the gain 1/G1 in multiplier 42 as the other input to multiplexer 38. Dither from generator 26 may be added to the gain scaling. Multiplexer 38 is responsive to select input 40 to selectively provide one of its inputs at its output.

Multiplexers 8 and 38 are both responsive to select input 40 such that when the input to multiplexer 8 that is multiplied by gain G1 is selected, the input to multiplexer 38 that is multiplied by gain 1/G1 is selected. Gain scaling employing gain G1 and 1/G1 result in a pulse code modulated output from multiplexer 38 that is full scale, 0 dB reference, when the analog input signal to analog sigma-delta modulator 716 is less than full scale. Gain G1 is selected to maintain unity gain. In the manner, the absolute gain of the analog-to-digital signal path (from multiplexer 8 input to multiplexer 38 output) is the same whether gain scaling is employed or not.

Saturation circuit 36 takes the 17-bit-per-sample fourth digital data stream output from multiplexer 38 and reduces each data sample to a 16 bit sample. The output of saturation circuit 36 is a 16-bit-per-sample fifth digital data stream.

The 16-bit-per-sample fifth digital data stream output from saturation circuit 36 is loaded into a first-in-first-out (FIFO) register 44. Register 44 stores several such samples of data. From FIFO 44, the 16 bit samples are temporarily transferred to register 46 prior to being written to random access memory (RAM) 48. Ram 48 is pan of digital signal processor (DSP) 50. A DSP is a special purpose microprocessor developed to efficiently perform mathematical operations on real-time digital dam. The samples are transferred by way of the internal data bus 52 as controlled by depth flag 54 and interrupt flag 56.

The digital-to-analog conversion signal path converts digital data from RAM 48 of DSP 50 into analog form at the output of analog demodulator 22. Digital data from RAM 48 of DSP 50 for conversion to analog form is written as a 16 bit sample temporarily to register 58. Each 16 bit sample is then transferred to FIFO 64 as controlled by depth flag 60, status flag 61, and interrupt flag 62. The output from FIFO 64 is a 16-bit-per-sample sixth digital data stream. The sixth digital data stream is input to interpolation filter 78 through multiplexer 68. The sixth digital data stream output from FIFO 64 is provided directly as one of the inputs to multiplexer 68. The sixth digital data stream is multiplied by the inverse of gain G2 in multiplier 72 as the other input to multiplexer 68. Multiplexer 68 is responsive to a select input 70 to selectively provide one of its inputs as its output. The output of multiplexer 68 is a seventh digital data stream.

The seventh digital data stream is provided as the input to interpolation filter 78. Interpolation filter 78 receives clocks CKL1 and CKL2. Clock CKL1 is clock CKOS divided by interpolation factor L1. Clock CLK2 is clock CLK1 divided by interpolation factor L2. The output from interpolation filter 78 is a 27-bit-per-sample eighth digital data stream. Interpolation filter 78, in a illustrative embodiment, is a third-order comb filter that removes out-of-band energy and produces the eighth digital data stream at a frequency of the over sampling frequency as divided by L1. The upstream portion of interpolation filter 78 operates at the lower clock rate CLK2. The downstream portion operates at the higher clock rate CLK1.

The eighth digital data stream provides the input to barrel shift selector 80. Barrel shift selector 80 receives the 27-bit-per-sample eighth digital data stream from the output of interpolation filter 78 and selects a field of 17 bits per sample to provide as its output, a ninth digital data stream. The field of barrel shift selector 80 is programmable. In the exemplary embodiment there are eleven possible seventeen bit fields. In a illustrative embodiment, the field of barrel shift selector 80 is programmed to select one of the top seven bit fields: 4–20; 5–21; 6–22; 7–23 through 10–26.

Saturation circuit 82 receives the 17-bit-per-sample ninth digital data stream output from barrel shift selector 80 and reduces each sample to 16 bits to provide a tenth digital data stream substantially in the same manner as saturation circuit 36.

Interpolation filter 84 receives the tenth digital data stream and operates at the oversampling clock rate, as divided by programmable divide by L1. The upstream portion of interpolation filter 84 operates at the lower clock rate CKL1. The downstream portion operates at the higher clock rate CKOS. Interpolation filter 84, in a illustrative embodiment, is a first-order comb filter that removes out of band energy and produces an eleventh digital data stream as an output.

The eleventh digital data stream output of interpolation filter 84 is coupled as the input to digital sigma-delta modulator 18. Digital sigma-delta modulator 18 in a illustrative embodiment is second order. Modulator 18 may receive dither from dither generator 26 and converts the 16-bit-per-sample data into a 1-bit-per-sample twelfth digital data stream.

The output of digital sigma delta modulator 18 provides an input to multiplexer 86. Multiplexer 86 is responsive to select input 88 to selectively provide one of the inputs at its output. The multiplexer output is a 1-bit-per-sample thirteenth digital data stream.

Analog demodulator 22 is a 1-bit sample and hold converter which converts the 1-bit-per-sample thirteenth digital data stream received from multiplexer 86 into a step wise continuous analog output signal. Analog demodulator 22 includes one or more analog filters as known in the art to smooth the analog output signal. The analog output signal from analog demodulator 22 is provided directly as one of the inputs to multiplexer 96 and is multiplied by gain G2 in multiplier 94 to provide the other input to multiplexer 96. Gain G2 may be achieved in any known manner. Multiplexer 96 is responsive to select input 70 to selectively provide one of its inputs as its output. The output of multiplexer 96 is an analog signal. Multiplexers 68 and 96 are both responsive to select input 70 such that when the input to multiplexer 68 that is multiplied by gain 1/G2 is selected, the input to multiplexer 96 that is multiplied by gain G2 is selected. Gain G2 is selected to maintain unity gain. In this manner, the absolute gain of the digital-to-analog signal path (from multiplexer 68 input to multiplexer 96 output) is the same whether or not gain scaling is employed.

Barrel shift selector 34 receives 20-bit PCM words from decimation filter 720 and is programmed to select one of several possible bit fields, in the illustrative embodiment one of four possible bit fields. The DC gain in a decimation filter is a function of the decimation factor, M1, raised to the power of the order of the comb filter. Generally, the DC gain of a comb decimation filter is a function of the transfer function raised to the K power, where K is the order of the comb function implemented by the comb filter. The magnitude response of decimation filter 720 is given by $$|H(\omega)| = \left[ \frac{\sin(\omega M1/2)}{\sin(\omega/2)} \right]^K$$

This transfer function has a DC gain of $(M1)^K$. The output of barrel shift selector 34 should normalize the DC gain such that the combined DC gain of the decimation filter and barrel shift selector ranges between $0.5 < DC\ gain \leq 1.0$ with respect to the number of PCM output bits from barrel shift selector 34.

Figure 2:
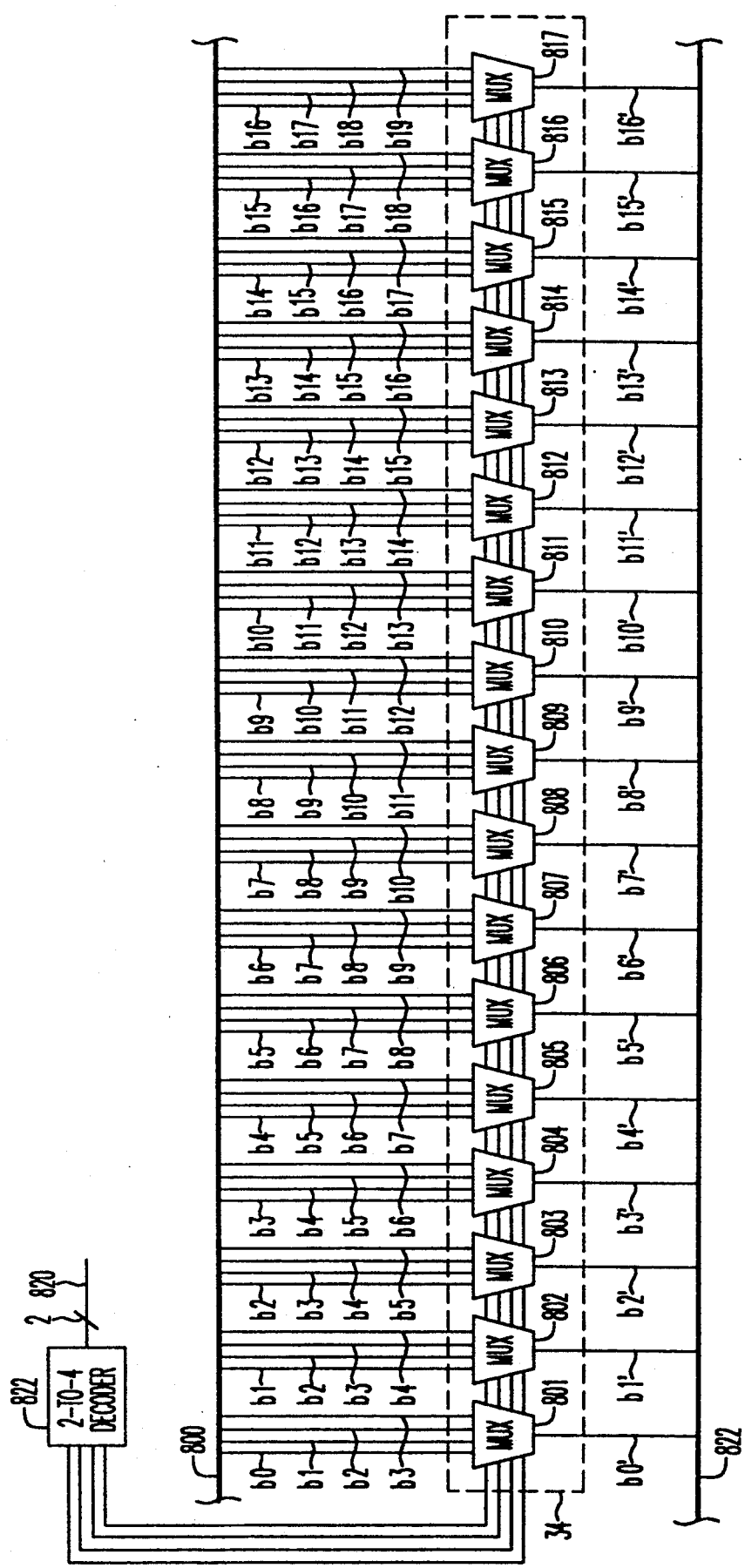
FIG. 2 is a circuit diagram showing a programmable barrel shift selector select a predetermined bit field from a wider bit field.

FIG. 2 is a schematic diagram of an illustrative embodiment of a programmable barrel shift selector 34 to accomplish the bit field selection. Input select 820 determines which of the four possible fields of 17-bits is selected for further processing. Once programmed by a user to select a particular one of the four possible 17-bit fields, barrel shift selector 34 continues to provide the selected 17-bit field as its output until reprogrammed to select another of the possible bit fields.

The 20-bit output from decimation filter 720 is received on bus 800. Barrel shift selector 34 has seventeen outputs, one from each of the multiplexers 801–817. To select from a 20-bit input and provide the full range of bit fields having 17 bits as outputs, each of the multiplexers 801–817 have four inputs. Multiplexer 801 receives bits b0, b1, b2, and b3. Similarly, multiplexer 802 receives bits b1, b2, b3, and b4. Multiplexer 817 receives bits b16, b17, b18, and b19. Each multiplexer is responsive to select inputs 820 to selectively provide one of its inputs as an output. Two-to-four decoder 822 decodes the two-bit input select 820 into one of four decoded input select combinations, resulting in four decoded input select signals that select one of the four input bits to each multiplexer as its respective output. The decoded input select signals provided to multiplexers 801–817 are commoned such that each multiplexer 801–817 simultaneously selects the first, second, third or fourth one of its inputs as its output. In this manner, the output of multiplexer 801 is the lowest bit in the 17-bit field, the output of multiplexer 802 is the second bit in the 17-bit field, through the output of multiplexer 817 which selects the highest bit in the 17-bit field. The bit field is determined by the user selectively programming select inputs 820. The selected bit field is provided on bus 822 as the output of barrel shift selector 34.

Figure 3:
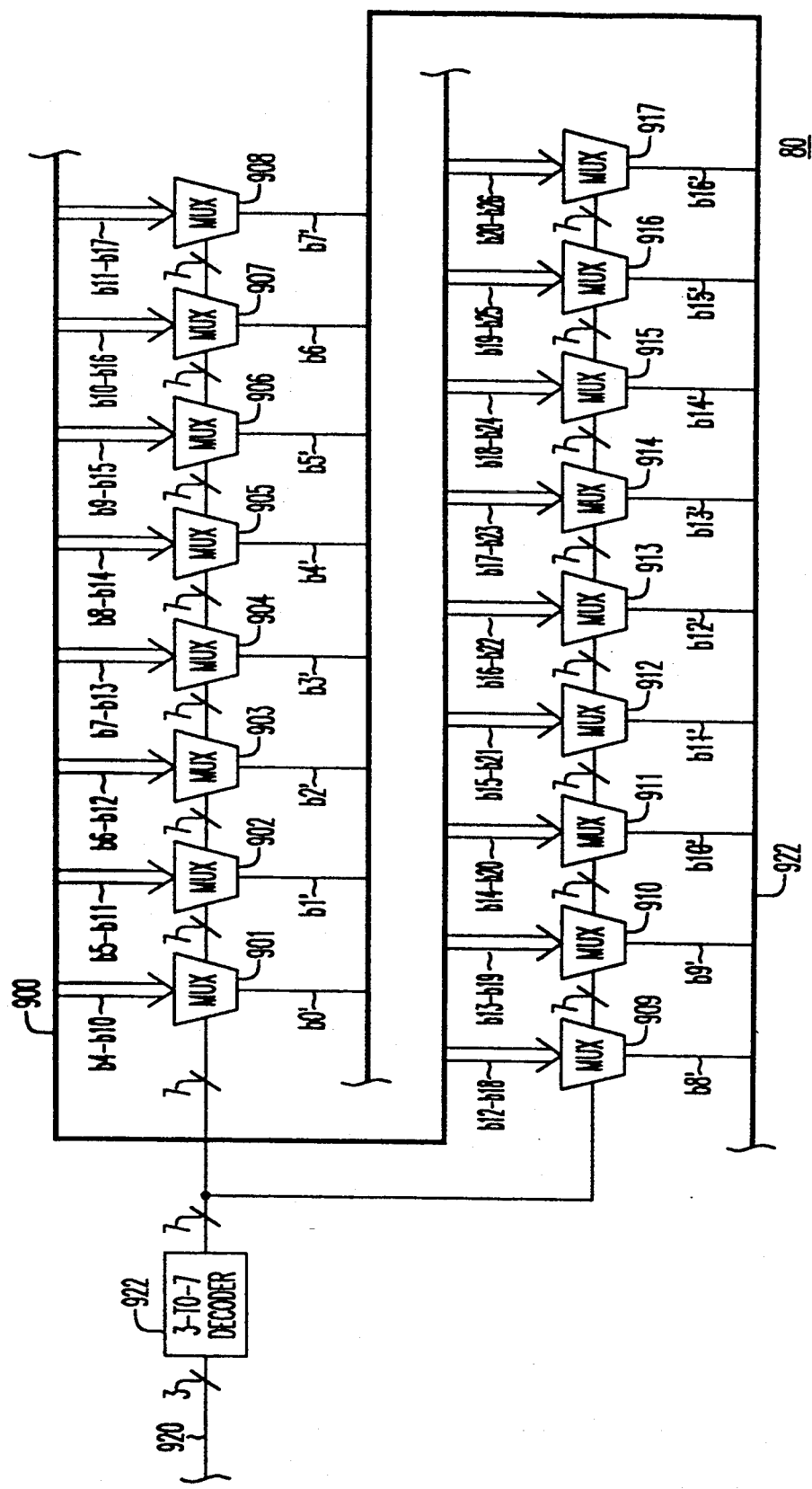
FIG. 3 is a circuit diagram showing an alternate embodiment programmable barrel shift selector.

FIG. 3 is a schematic diagram of barrel shift selector 80. The 27-bit output from interpolation filter 78 is received on bus 900. Barrel shift selector 80 has 17 outputs, one from each of multiplexers 901–917. To select from a 27-bit input and provide the seven different bit fields, bits 4–20 through 10–26, as outputs, each of the multiplexers 901–917 have seven inputs. Multiplexer 901 receives bits b0–b10. Similarly, multiplexer 802 receives bits b5–b11, multiplexer 803 receives bits b6–b12, through multiplexer 917 which receives bits b20–b26. Each multiplexer is responsive to select 920 inputs to selectively provide one of its inputs as its output. Three-to-seven decoder 922 decodes the three-bit input select 920 into one of seven decoded input select combinations, resulting in seven decoded input select signals that select one of the seven input bits to each multiplexer as its output. The decoded input select signals provided to multiplexers 901 through 917 are commoned such that multiplexer 901 selects the lowest bit in the 17-bit field and multiplexer 917 selects the highest bit in the 17-bit field. The bit field is determined by selectively programming select inputs 920. The 17 bits of the selected bit field are provided on bus 822 to saturation circuit 82.

Barrel shift selector 34 is provided because of the variable number of bits received from decimation filter 720. The most significant 17 bits are selected for a given decimation factor, M1. The number of bits in each pulse code modulated word produced by decimation filter 720 for each 1-bit input is: $2 + \log_2 M1^K$, where M1 is the decimation factor of decimation filter 720 and K is the order of the comb filter. In the exemplary embodiment, M1 is limited to 64 and K is limited to 3. This combination results in a maximum of $2 + \log_2 64^3$ or nineteen additional bits for a total of 20 bits output from decimation filter 720. Table I shows the range of decimation factor M1, the corresponding select input 820, and the DC gain at the output of barrel shift selector 34.

TABLE I

| M1 | Select Input 820 | DC Gain | Output bit field |
|---|---|---|---|
| $1 \leq M1 \leq 32$ | 00 | $(M1)^3/2^{15}$ | 0–16 |
| $33 \leq M1 \leq 40$ | 01 | $(M1)^3/2^{16}$ | 1–17 |
| $41 \leq M1 \leq 50$ | 10 | $(M1)^3/2^{17}$ | 2–18 |
| $51 \leq M1 \leq 64$ | 11 | $(M1)^3/2^{18}$ | 3–19 |

As can be seen from Table I, when the decimation factor M1 ranges from 1–32, inclusive, barrel shift selector 34 provides bits 0–16 as the output field. When the decimation factor is between 33–40, inclusive, barrel shift selector 34 provides bits 1–17 as the output field. When the decimation factor is between 41–50, inclusive, barrel shift selector 34 provides bits 2–18 as the output field. When the decimation factor is between 51–64, inclusive, barrel shift selector 34 provides bits 3–19 as the output field.

Barrel shift selector 80 is provided to accommodate the variable number of bits received from interpolation filter 78. For interpolation filter 78, the number of bits produced at the output is $17 + \log_2 (L2)^{K-1}$, where L2 is the interpolation factor of interpolation filter 78. In an exemplary embodiment, L2 is limited to 32 and, as above, K is limited to 3. The magnitude response of interpolation filter 78 is given by $$|H(\omega)| = \left[ \frac{\sin(\omega L2/2)}{\sin(\omega/2)} \right]^K$$

This transfer function has a DC gain of $(L2)^K$. The output of barrel shift selector 80 should normalize the DC gain such that the combined DC gain of the interpolation filter and barrel shift selector ranges between $0.5 < DC\ gain \leq 1.0$ with respect to the number of PCM output bits from barrel shift selector 80. Table II includes the range of interpolation factor L2, the select input 920, and the DC gain at the output of barrel shift selector 80.

TABLE II

| L2 | Select Input 920 | DC Gain | Output bit field |
|---|---|---|---|
| $23 \leq L2 \leq 32$ | 11X | $(L2)^2/2^{10}$ | 10–26 |
| $17 \leq L2 \leq 22$ | 101 | $(L2)^2/2^9$ | 9–25 |
| $12 \leq L2 \leq 16$ | 100 | $(L2)^2/2^8$ | 8–24 |
| $9 \leq L2 \leq 11$ | 011 | $(L2)^2/2^7$ | 7–23 |
| $6 \leq L2 \leq 8$ | 010 | $(L2)^2/2^6$ | 6–22 |
| $4 \leq L2 \leq 5$ | 001 | $(L2)^2/2^5$ | 5–21 |
| $1 \leq L2 \leq 3$ | 000 | $(L2)^2/2^4$ | 4–20 |

X = don't care

As can be seen from Table II, when the interpolation factor L2 is from 23–32, inclusive, barrel shift selector 80 provides bits 10–26 as the output field. When the interpolation factor is 17–22, barrel shift 80 provides bits 9–25 as the output field. When the interpolation factor is from 12–16, inclusive, the barrel shift selector 80 provides bits 8–24 as the output field. When the interpolation factor is 9–11, inclusive, the barrel shift selector 80 provides bits 7–23 as the output. Similarly, when the interpolation factor is in one of the ranges 6–8, 4–5, or 1–3, inclusive, bits 6–22, 5–21, and 4–20 are provided respectively as the output field.

The output of each barrel shift selector is provided to a saturation circuit. Saturation circuits 36 and 82 each receive and 17-bit input and provide a 16-bit output. As is known in the art, saturation circuits 36 and 82 saturate overshoot that occurs as a result of filtering in decimation filter 720 and interpolation filter 78, respectively.

The invention is particularly useful in communication systems and equipment employing this technique. Such communication systems and equipment have the advantage of selecting the most significant bits from a multiple bit sample such that a limited-width bus can can be employed without regard to the number of bits of data available.

The invention is not limited to the numerical values used to disclose the illustrative embodiment. The bit-width output from various elements, the order of the various filters, the ranges for the interpolation and decimation factors and the output fields and ranges for the barrel shift selector and the number of bits of saturation, and the like, are exemplary in the illustrated embodiment.

While illustrative embodiment of the invention has not been described as incorporating pipelining or paralleling to reduce latency times, one skilled in the art would recognize the enhanced computational efficiency available by utilizing such techniques.

I claim:

1. Apparatus for converting a signal from one form to another, comprising:
   a converter for converting signals from a first form to a second form, one of the forms being analog and the other being digital, the converter having an analog side and a digital sample side; and
   a programmable barrel shift selector on the digital sample side for receiving digital signal samples having a first bit field width and for selecting therefrom digital signal samples having a second bit field width as the output, the second bit field width being programmable over a contiguous range to selectively determine which bits in the first bit field are included in the second bit field.

2. Apparatus for converting a signal from one form to another, comprising:
   a converter for converting signals from a first form to a second form, one of the forms being analog and the other being digital, the converter having an analog side and a digital sample side;
   a programmable barrel shift selector on the digital sample side for receiving digital signal samples having a first bit field width and for selecting therefrom digital signal samples having a second bit field width as the output, the second bit field width being programmable over a range to selectively determine which bits in the first bit field are included in the second bit field; and
   a saturation circuit, the saturation circuit for receiving the output of the barrel shift selector and for reducing the bit field width thereof.

3. Apparatus as recited in claim 2, wherein the saturation circuit reduces the bit field width of the barrel shift selector output by one bit.

4. Apparatus for converting a signal from one form to another, comprising:
   a converter for converting signals from a first form to a second form, one of the forms being analog and the other being digital, the converter having an analog side and a digital sample side; and
   a programmable barrel shift selector on the digital sample side for receiving digital signal samples having a first bit field width and for selecting therefrom signal samples having a second bit field width as the output, the second bit field width being programmable over a range to selectively determine which bits in the first bit field are included in the second bit field, the converter comprising a filter defining a first DC gain, and wherein the barrel shift selector defines a second DC gain, the product of the first DC gain and the second DC gain falling between approximately 0.5 and 1.0, inclusive.

5. Apparatus for providing sample rate conversion, comprising:
   a converter for receiving a clock signal, a divided-down clock signal, and first digital signal samples at a first rate, the converter for converting the first digital signal samples to second digital signal samples at a second rate and having a first bit field width, the ratio of the first rate to the second rate defining a conversion rate factor,
   a programmable counter, the programmable counter for receiving the clock signal and for dividing down the clock signal to produce the divided-down clock signal, the programmable counter being programmable to selectively determine the conversion rate factor; and
   a programmable barrel shift selector for receiving the second digital signal samples and for selecting therefrom digital signal samples of a second bit field width as the output, the second bit field width being programmable over a range to selectively determine which bits in the first bit field are included in the second bit field.

6. Apparatus as recited in claim 5, wherein the range over which the second bit field is programmable is contiguous.

7. Apparatus as recited in claim 5, further comprising:
   a saturation circuit, the saturation circuit for receiving the output of the barrel shift selector and for reducing the bit field width thereof.

8. Apparatus as recited in claim 7, wherein the saturation circuit reduces the bit field width of the barrel shift selector output by one bit.

9. Apparatus as recited in claim 5, wherein the converter comprises a filter defining a first DC gain, and wherein the barrel shift selector defines a second DC gain, the product of the first DC gain and the second DC gain falling between approximately 0.5 and 1.0, inclusive.

10. Apparatus as recited in claim 1, wherein the first form of signals is analog and the second form of signals is digital.

11. Apparatus as recited in claim 1, wherein the first form of signals is digital and the second form of signals is analog.

12. An analog-to-digital converter, comprising:
a modulator for receiving an analog signal and for converting the analog signal to a first digital data stream;
a decimation filter for receiving the first digital data stream and for decimating the first digital data stream into a second digital data stream, the second digital data stream having a bit field width greater than the first digital data stream; and
a programmable barrel shift selector for receiving the second digital data stream and for selecting therefrom as an output digital signal samples of a bit field width that is less than the bit field width of the second digital data stream, the bit field width of the digital signal samples being programmable over a range to selectively determine which bits in the second digital data stream are included in the digital signal samples.

13. An analog-to-digital converter as recited in claim 12, wherein the range over which the bit field width of the digital signal samples is programmable is contiguous.

14. An analog-to-digital converter as recited in claim 12, further comprising:
a saturation circuit, the saturation circuit coupled to the barrel shift selector for receiving the output of the barrel shift selector and for reducing the bit field width thereof.

15. An analog-to-digital converter as recited in claim 14, wherein the saturation circuit reduces the bit field width of the barrel shift selector output by one bit.

16. A digital-to-analog converter, comprising:
a first interpolation filter for receiving a first digital data stream and for interpolating the first digital data stream to produce a second digital data stream, the second digital data stream having a bit field width greater than the first digital data stream;
a programmable barrel shift selector coupled to the first interpolation filter for receiving the second digital data stream and for selecting therefrom as an output digital signal samples of a bit field width that is less than the bit field width of the second digital data stream, the bit field width of the digital signal samples being programmable over a range to selectively determine which bits in the second digital data stream are included in the digital signal samples; and
an analog demodulator coupled to the barrel shift selector, the analog demodulator receiving as inputs the digital signal samples output from the barrel shift selector and converting the digital signal samples into a step-wise continuous analog output signal.

17. A digital-to-analog converter as recited in claim 16, wherein the range over which the bit field width of the digital signal samples is programmable is contiguous.

18. A digital-to-analog converter as recited in claim 16, further comprising:
a saturation circuit, the saturation circuit coupled to the barrel shift selector for receiving the output of the barrel shift selector and for reducing the bit field with thereof.

19. A digital-to-analog converter as recited in claim 18, wherein the saturation circuit reduces the bit field width of the barrel shift selector output by one bit.

20. A digital-to-analog converter as recited in claim 16, further comprising:
a second interpolation filter, the second interpolation filter coupled between the barrel shift selector and the analog demodulator, the second interpolation filter receiving the digital signal samples output from the barrel shift selector and interpolating the digital signal samples to produce second digital signal samples, the second digital signal samples being provided as inputs to the analog demodulator.

* * * * *